United States Patent
Tanaka et al.

(10) Patent No.: US 9,462,684 B2
(45) Date of Patent: Oct. 4, 2016

(54) WIRING MATERIAL, METHOD FOR FABRICATING THE SAME, AND SECONDARY BATTERY DEVICE AND ELECTRONIC EQUIPMENT USING THE SAME

(71) Applicant: Hitachi Metals, Ltd., Tokyo (JP)

(72) Inventors: Kotaro Tanaka, Naka (JP); Toshiyuki Horikoshi, Mito (JP); Takumi Sato, Hitachi (JP); Kenichi Murakami, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 41 days.

(21) Appl. No.: 14/077,865

(22) Filed: Nov. 12, 2013

(65) Prior Publication Data

US 2014/0131071 A1    May 15, 2014

(30) Foreign Application Priority Data

| Nov. 14, 2012 | (JP) | ................................. | 2012-250495 |
| Nov. 14, 2012 | (JP) | ................................. | 2012-250496 |
| Jun. 5, 2013 | (JP) | ................................. | 2013-118478 |
| Jun. 5, 2013 | (JP) | ................................. | 2013-118479 |

(51) Int. Cl.
| H01B 7/08 | (2006.01) |
| H05K 1/02 | (2006.01) |
| H01B 13/012 | (2006.01) |
| H05K 1/18 | (2006.01) |

(52) U.S. Cl.
CPC ........ *H05K 1/028* (2013.01); *H01B 13/01254* (2013.01); *H05K 1/189* (2013.01); *H05K 2201/052* (2013.01); *H05K 2201/10037* (2013.01); *Y10T 29/49117* (2015.01)

(58) Field of Classification Search
CPC ...... H05K 1/028; H05K 1/118; H05K 1/189; H05K 1/117; H05K 1/095; H05K 1/0393; H05K 2201/052; H05K 2201/10037; H05K 2201/053; H05K 2201/10393; H05K 2201/048; H05K 2201/09145; H05K 2201/057; H05K 2201/2009; H05K 2201/10189; H05K 3/4644; H05K 3/363; H05K 3/28; H01B 7/08; H01B 7/0823; H01B 13/01254; H01B 13/144; H02G 3/00; H01R 4/2495; H01R 12/59; H01R 12/69; H01R 12/616; B29C 47/027; B29C 47/003; B29C 47/1281; Y10T 29/4911
USPC ....... 174/254, 72 A, 117 F, 120 AR, 120 SR; 264/171.21; 29/835; 361/826, 692, 361/785, 818, 749; 439/493, 557, 325, 498, 439/422
See application file for complete search history.

(56) References Cited

U.S. PATENT DOCUMENTS

| 4,065,199 | A | * | 12/1977 | Andre | ...................... | H01B 7/08 |
| | | | | | | 174/72 A |
| 4,783,579 | A | * | 11/1988 | Brandolf et al. | ....... | 174/117 FF |
| 4,974,121 | A | * | 11/1990 | Masuko | ................... | H02G 3/00 |
| | | | | | | 361/692 |
| 5,460,530 | A | * | 10/1995 | Toba | ................... | B60R 16/0207 |
| | | | | | | 174/72 A |
| 6,392,148 | B1 | * | 5/2002 | Ueno | ................... | B60R 16/0215 |
| | | | | | | 174/117 F |
| 2002/0028600 | A1 | * | 3/2002 | Kondo | ......................... | 439/502 |
| 2007/0271044 | A1 | * | 11/2007 | Gutierrez et al. | ............. | 702/45 |

FOREIGN PATENT DOCUMENTS

| JP | 09298017 A | 11/1997 |
| JP | 10021755 A | 1/1998 |
| JP | 2002-157924 | 5/2002 |
| JP | 2002-203431 | 7/2002 |

OTHER PUBLICATIONS

Japanese Office Action for corresponding Japanese Patent Application No. 2013-118478 dated May 31, 2016 and English translation thereof.
Japanese Office Action for corresponding Japanese Patent Application No. 2013-118479 dated May 31, 2016 and English translation thereof.

* cited by examiner

*Primary Examiner* — Timothy Thompson
*Assistant Examiner* — Guillermo Egoavil
(74) *Attorney, Agent, or Firm* — Roberts Mlotkowski Safran Cole & Calderon, PC

(57) ABSTRACT

A wiring material includes conductors, each of which has a cross section having a thickness and a width not less than the thickness, a trunk portion in which the conductors are spaced parallel in a direction of the width thereof, a branch portion in which each conductor is bent and branched from the trunk portion in the direction of the width or in a direction that intersects the direction of the width, and a covering member for covering the trunk portion and the branch portion to expose both ends of the conductors.

10 Claims, 11 Drawing Sheets

WIRING MATERIAL, METHOD FOR FABRICATING THE SAME, AND SECONDARY BATTERY DEVICE AND ELECTRONIC EQUIPMENT USING THE SAME

The present application is based on Japanese patent application No. 2012-250495 filed on Nov. 14, 2012, Japanese patent application No. 2012-250496 filed on Nov. 14, 2012, Japanese patent application No. 2013-118478 filed on Jun. 5, 2013 and Japanese patent application No. 2013-118479 filed on Jun. 5, 2013, the entire contents of which are incorporated herein by reference.

BACKGROUND OF THE INVENTION

1. Field of the Invention

The present invention relates to a wiring material for a flexible printed circuit (FPC) and the like and a for fabricating the wiring material as well as a secondary battery device and an electronic equipment using the same.

2. Description of the Related Art

As to the internal wirings to be used in automobiles, large electronic equipment, large mechatronics equipment or the like, it has been conventionally easy to ensure a sufficient wiring space because a casing therefor is large. It has therefore been possible to respond to complex wiring by using a wire harness with a plurality of cables bundled together. On the other hand, in small electronic equipment or small mechatronics equipment, the wiring space is required to be minimized in order to provide a plurality of functions in a small casing therefor. Therefore, a small film wiring material such as a flexible printed circuit (FPC) has been used for the internal wiring in such small equipment.

In recent years, even in the automotive applications, or the large mechatronics equipment, the equipment configuration with a size equal to or smaller than the conventional device has been required as well as the function enhancement. As a result, such a film wiring material as that used in the small electronic equipment or the mechatronics equipment has been required as the wiring in large equipment.

For example, a lithium ion secondary battery module to be mounted on an electric vehicle or a hybrid vehicle has such a structure that a plurality of single-battery cells are placed therein, and electrode terminals of the adjacent battery cells are connected each other by a connecting member such as a bus bar or the like. When the lithium ion secondary battery is excessively charged, overheat may occur. Further, when the lithium ion secondary battery is excessively discharged, the charging or discharging function may be lowered due to melting of the electrode material. It is therefore necessary to control voltage with very high accuracy of the order of several dozen of mV. Accordingly, each bus bar to be connected to each cell is connected to a control circuit and a protection circuit via a wiring material for monitoring the potential of each electrode.

Based on the size of the secondary battery module, the wiring material for voltage monitoring has a length of about 0.5 to 1 m. Further, because the wiring distances from the circuit board to respective bus bars are different, the wiring material has a plurality of conductors and an arbitrary wiring pattern in which the conductors are branched from the bundle of the plurality of conductors.

Because of the demand for miniaturization and high capacity of the lithium ion secondary battery, the number of battery cells and the number of the wiring materials are increased, while the area occupied by the wiring material is required to be reduced. Further, since the wiring of arbitrary pattern is required, the FPC or the like is used for the wiring material. The use of the thin wiring material such as FPC allows reducing the area occupied by the wiring material. Further, it is possible to prevent incorrect wiring during battery module assembly, or simplify the positioning work of the bus bar and the wiring material for the connection by forming the pattern shape in advance so as to conform to the position of each bus bar.

Also, for example, in a digital multifunction printer with copying machine, scanner, and the like combined together, it is necessary to provide wiring between a control circuit and a movable part such as a scanner reading mechanism, etc. in addition to the wiring in the apparatus. In the wiring material, the wiring length may exceed 1 m in particular when compatible with A0 size (84.1 cm×118.9 cm). Also, the wiring with the movable part side control circuit such as scanner head or ink-jet head is constituted from a branch portion to branch to the control circuit and a lengthy straight portion for a margin of the movable range. Therefore, as a wiring material of the digital multifunction printer, FPC or the like which is capable of arbitrary pattern wiring is used, similarly to the wiring material for voltage monitoring mentioned above.

The FPC, which is one example of the wiring material, is produced by a process of forming a wiring pattern by photolithography on a film base material with a copper foil bonded to a polyimide film which is a covering member, and removing an unnecessary copper portion by etching.

The FPC wastes much copper material due to the copper foil etching for the conductor pattern formation. Further, materials (photoresist, developer, washing solution, etc.) other than the etching agent are required. In particular, in the case of fabricating the wiring material for the voltage monitoring or the digital multifunction printer, the simpler such a structure that the wiring pattern is not complex and dense as in an electronic circuit, and the lengthy conductors are branched, the more the waste material is produced, resulting in an increase in cost.

Further, conventional wiring materials have been mainly used for forming the circuit of several cm square. However, the wiring material for the voltage monitoring or the digital multifunction printer has a length of about 0.5 to 1 m, or longer, existing photolithographic apparatus cannot be used for such a wiring material. Therefore, it is necessary to increase the size of the photolithographic apparatus, and the cost of producing the wiring material is therefore further increased. Because of the use of the copper foil, the FPC is very thin in conductor thickness, and increases in conductor resistance when it comes to increasing the size as described above.

A flat harness (wiring material) disclosed by JP-A-2002-157924 comprises copper wires each having a circular cross section that are laid on the same plane along a predetermined wiring pattern and covered with an insulating film from both sides. This flat harness can be produced without including any etching step.

A flat harness disclosed by JP-A-2002-203431 comprises a ribbon cable as a first flat cable, and a FPC as a second flat cable that is connected via a connecting portion to an intermediate position on the first flat cable, wherein conductors of the first flat cable, and conductors of the second flat cable are partially and electrically connected each other. According to this configuration, the flat harness without any large size FPC is provided by using the FPC in only the second flat cable, i.e., the portion branched from the first flat cable.

SUMMARY OF THE INVENTION

However, in the wiring material disclosed by JP-A-2002-157924, the conductors having circular cross section are used, so that the diameter of the conductors will be reduced if the wiring material is further thinned. As a result, the conductor resistance of the wiring material will rise. Further, although it is possible to suppress the increase in the conductor resistance of the wiring material by increasing the number of conductors, the step of laying the conductors increases.

With the wiring material disclosed by JP-A-2002-203431, since it is impossible to form a branched wiring structure in the ribbon cable, the FPC is used for the branch portion that is branched from the ribbon cable (trunk portion). However, the step of connecting the FPC and the ribbon cable is further required. In addition, the connecting portion for connecting the FPC and the ribbon cable may become thick.

Further, there is the problem that the strength of the connecting portion of the FPC and the ribbon cable may be weakened. Another problem is that the number of connection points between the ribbon cable and FPC increases, resulting in the increase in cost.

Accordingly, it is an object of the present invention to provide a wiring material and a method for fabricating the same as well as a secondary battery device and an electronic equipment using the same, which can suppress an increase in conductor resistance and which can simplify the producing process even when the wiring material is thinned.

Further, it is another object of the present invention to provide a wiring material and a method for fabricating the same as well as a secondary battery device and an electronic equipment using the same, which can maintain the strength of a branch portion.

In order to achieve the above objects, one aspect of the present invention provides a wiring material below and a method for fabricating the same below as well as a secondary battery device and an electronic equipment using the same.

(1) According to a feature of the invention, a wiring material comprises:

conductors, each of which has a cross section comprising a predetermined thickness and a width not less than the predetermined thickness;

a trunk portion in which the conductors are spaced parallel in a direction of the width thereof;

a branch portion in which each conductor is bent and branched from the trunk portion in the direction of the width or in a direction that intersects the direction of the width; and a covering member for covering the trunk portion and the branch portion to expose both ends of the conductors.

(i) Each conductor may have a rectangular cross section.

(ii) The covering member may comprise:

a first covering member for covering the trunk portion to expose an end of each conductor on a side of the trunk portion; and a second covering member for covering the branch portion to expose an end of the conductor on a side of the branch portion.

(iii) The second covering member may be partially overlapped with the first covering member to cover a portion of the trunk portion covered with the first covering member.

(2) According to another feature of the invention, a method for fabricating a wiring material comprises:

producing conductors each having a cross section comprising a predetermined thickness and a width not less than the predetermined thickness;

providing a trunk portion with the conductors spaced parallel in a direction of the width thereof;

bending and branching each conductor from the trunk portion in the direction of the width or in a direction that intersects the direction of the width, to thereby form a branch portion; and superimposing a pair of covering members together to cover the trunk portion and the branch portion to expose both ends of the conductors.

(i) The branching may include:

using a fixing member including an arcuate surface and a first flat surface following the arcuate surface, bringing a side surface of the conductor into contact with the first flat surface to fix the conductor, and using a movable member including a second flat surface, bringing the second flat surface into contact with an opposite side surface of the conductor to the side surface in contact with the first flat surface of the conductor, moving the movable member along the arcuate surface of the fixing member and bending the conductor.

(ii) The method may further comprise removing a region where the pair of the covering members are in contact with each other.

(iii) The covering of the trunk portion may include superimposing a pair of first covering members together to cover the trunk portion to expose an end of each conductor on a side of the trunk portion, and the covering of the branch portion includes superimposing a pair of second covering members together to cover the branch portion to expose an end of the conductor on a side of the branch portion.

(iv) The covering of the branch portion with the pair of the second covering members may comprise partially overlapping the second covering members with the first covering member to cover a part of the trunk portion covered with the first covering member.

(3) According to a still another feature of the invention, a secondary battery device comprises the wiring material as described above.

(4) According to a further feature of the invention, an electronic equipment comprises the wiring material as described above.

Effects of the Invention

According to the present invention, it is possible to provide a wiring material and a method for fabricating the same as well as a secondary battery device and an electronic equipment using the same, which can suppress an increase in conductor resistance and which can simplify the producing process even when the wiring material is thinned.

Further, it is also possible to provide a wiring material and a method for fabricating the same as well as a secondary battery device and an electronic equipment using the same, which can maintain the strength of a branch portion.

BRIEF DESCRIPTION OF THE DRAWINGS

The preferred embodiments according to the invention will be explained below referring to the drawings, wherein:

FIGS. 7A to 7C show a schematic of a bending apparatus, wherein FIG. 7A is a perspective view showing a fixing member, FIG. 7B is a perspective view showing a movable member, and FIG. 7C is a perspective view showing a state in which the movable member and the fixing member are combined together;

FIGS. 8A and 8B show operation of the bending apparatus, wherein FIG. 8A is a transverse cross-sectional view showing a state before bending the conductor, and FIG. 8B is a transverse cross-sectional view showing a state after bending the conductor;

DETAILED DESCRIPTION OF THE PREFERRED EMBODIMENTS

Next, preferred embodiments according to the invention will be explained below in conjunction with the accompanying drawings. Incidentally, in these drawings, elements including substantially the same functions are given the same numerals, and duplicate descriptions thereof are omitted.

SUMMARY OF THE EMBODIMENTS

A wiring material in the embodiments comprises conductors and covering materials, characterized by that the wiring material comprises a trunk portion in which the conductors, each of which has a cross section comprising a predetermined thickness and a width not less than the predetermined thickness, are spaced parallel in a direction of the width thereof in a trunk, a branch portion in which each conductor is bent and branched from the trunk portion in the direction of the width or in a direction that intersects the direction of the width, and a covering member for covering the trunk portion and the branch portion to expose both ends of the conductors.

First Embodiment

Figure 1:
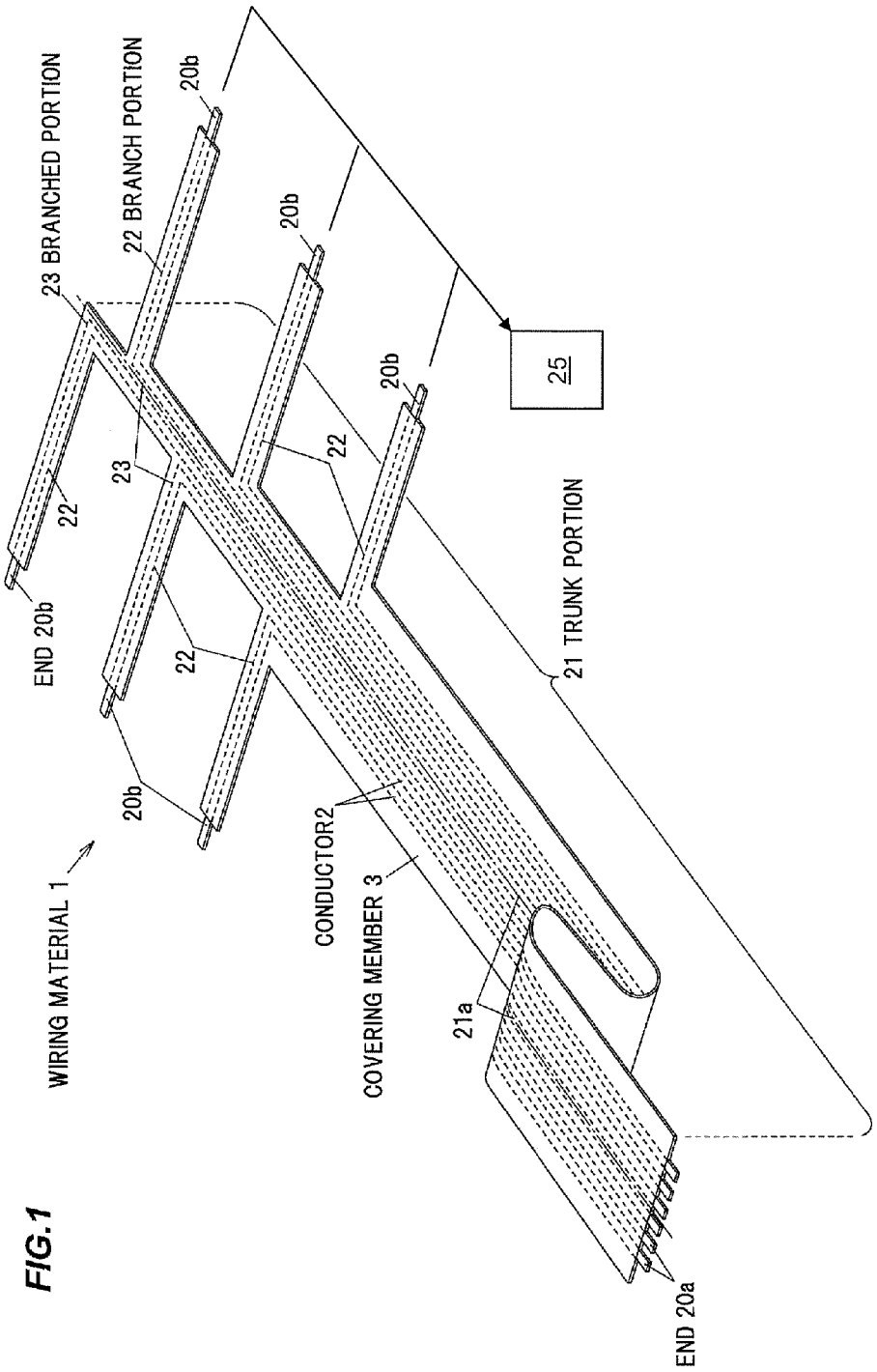
FIG. 1 is a perspective view showing the appearance of a wiring material in the first embodiment according to the present invention.

FIG. 1 is a perspective view showing the appearance of a wiring material in the first embodiment according to the present invention. The wiring material 1 comprises a plurality (six in the present embodiment) of conductors 2, each of which has a cross section comprising a predetermined thickness and a width greater than the predetermined thickness, a trunk portion 21 in which the plurality of the conductors 2 are spaced parallel in a direction of the width thereof, a branch portion 22 in which each conductor 2 is bent and branched from the trunk portion 21 in the direction of the width of the conductors 2, a covering member 3 for covering the trunk portion 21 and the branch portion 22 in such a manner as to expose both ends 20a and 20b of the plurality of the conductors 2, and branched portions 23 in which at least one (six in the present embodiment) of the conductors 2 is branched in the direction of the width of the conductors 2. As is schematically indicated in FIG. 1, the ends 20b of the conductors 2 in the branch portions 22 may be connected to a component of electronic equipment 25, which may be a secondary battery.

(Conductor)

The trunk portion 21 is composed of portions of the conductors 2 from one end 20a of each conductor 2 until the branched portion 23. The branch portion 22 is composed of a portion of each conductor 2 from the branched portion 23 to the other end 20b of each conductor 2. The branch portion 22 is branched from the trunk portion 21 towards the outer side of the trunk portion 21 so as not to overlap with the trunk portion 21 and the other branch portions 22.

The branched portions 23 refer to a portion of the conductor 2 branched in a different direction from a center line 21a of the trunk portion 21. The branched portion 23 is bent e.g. in the direction of the width of the conductors 2, i.e. the conductor 2 is bent in the direction of an angle of 90 degrees to the center line 21a so that respective ends 20b are located equidistant from the center line 21a of the trunk portion 21. Incidentally, the angle of bending the conductor 2 at the branched portion 23 is not limited to 90 degrees to the center line 21a, but may be in a direction that intersects the direction of the width of the conductors 2 of the trunk portion 21, e.g, at any angle of 45 degrees or 135 degrees to the center line 21a.

As the material of the conductors 2, e.g. oxygen free copper, tough pitch copper, copper alloy, aluminum, nickel or the like may be used. Further, a conductor surface may be plated with nickel, tin or the like. Further, for the conductor 2, a round wire is used by being rolled to have a rectangular cross section, or a round wire is drawn by using a rectangular die to have a rectangular cross section. For example, the conductor 2 is consisted of copper, and is formed to have a 0.2 mm thick and 1 mm wide rectangular cross section. Because a copper foil of a FPC which has been conventionally used is about 35 μm in thickness, its conductor resistance is much greater than that of the conductor 2 of the present invention. Assuming that an attempt is made to implement the wiring material using the copper foil for the conductors to have a conductor resistance of the same order of that of the conductors 2 of the present invention, the width of the copper foil is required to be set at about 5.7 mm in order to increase the cross-sectional area of the conductor, so that there is a disadvantage in that the width of the wiring material becomes very large. Accordingly, in the present embodiment, it is possible to reduce the conductor resistance in comparison with the conductors using the copper foil, by providing the conductor 2 with the rectangular cross section. Further, in the conductor of the same thickness in comparison to the circular conductor, since the rectangular shape is large in the cross-sectional area, the conductor resistance of the conductor 2 can be reduced. Incidentally, the conductor 2 may have a square cross-sectional shape, or a cross-sectional shape whose side surface, upper surface or lower surface is arcuate.

(Covering Member)

The covering member 3 comprises a pair of covering members 3A and 3B, and the pair of covering members 3A and 3B sandwich the plurality of conductors 2 therebetween, cover the trunk portion 21 and the branch portions 22 so as to expose the ends 20a and 20b, and insulate the conductors 2. The covering member 3 is bonded to the conductors 2 with an adhesive (not shown) applied to the facing surface.

Incidentally, the covering member 3 may cover the trunk portion 21 and the branch portions 22 by a method such as fusion.

As the covering member 3, e.g. general polyimide, polyamide, polyethylene terephthalate or the like, which is typically as an insulating member, may be used. As an adhesive, e.g. epoxy based adhesive, polyester based adhesive or the like may be used.

(Method for Fabricating the Wiring Material)

Figure 2:
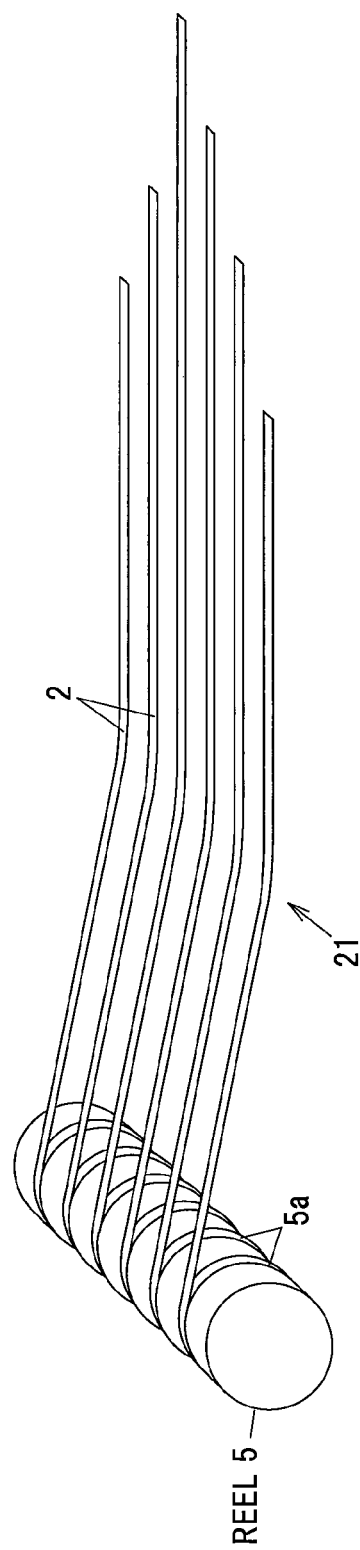
FIG. 2 is a perspective view schematically showing the step of drawing conductors from a reel.
Figure 3:
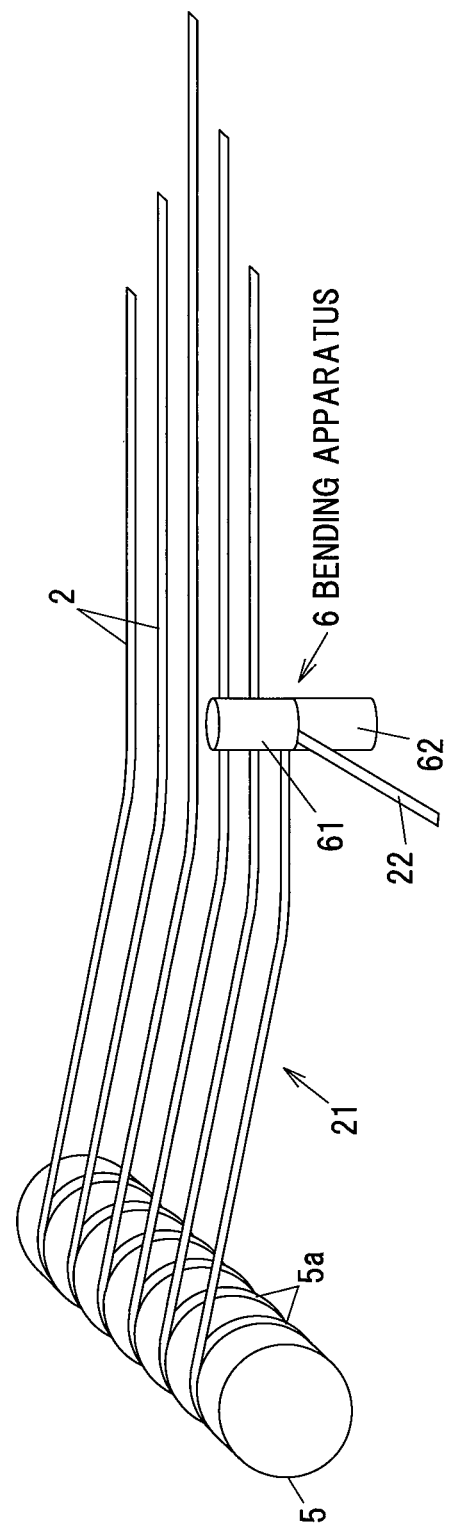
FIG. 3 is a perspective view schematically showing the step of bending the conductor.
Figure 4:
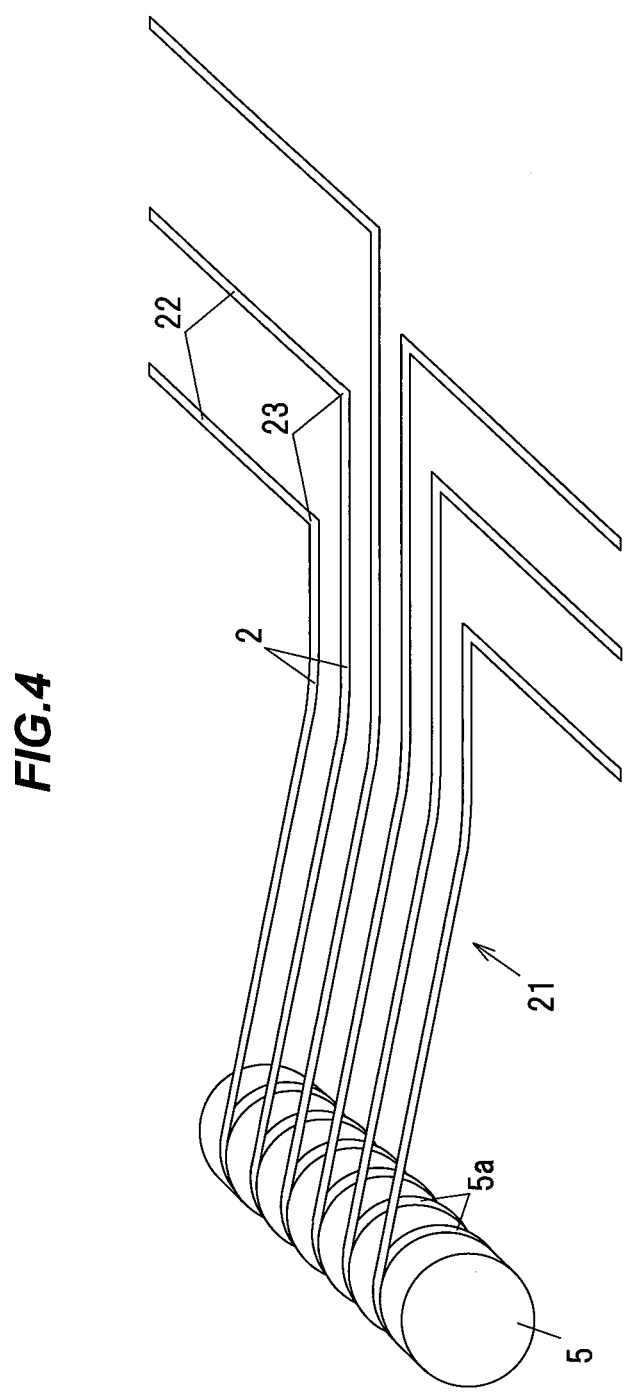
FIG. 4 is a perspective view schematically showing a state in which each conductor is branched.
Figure 5:
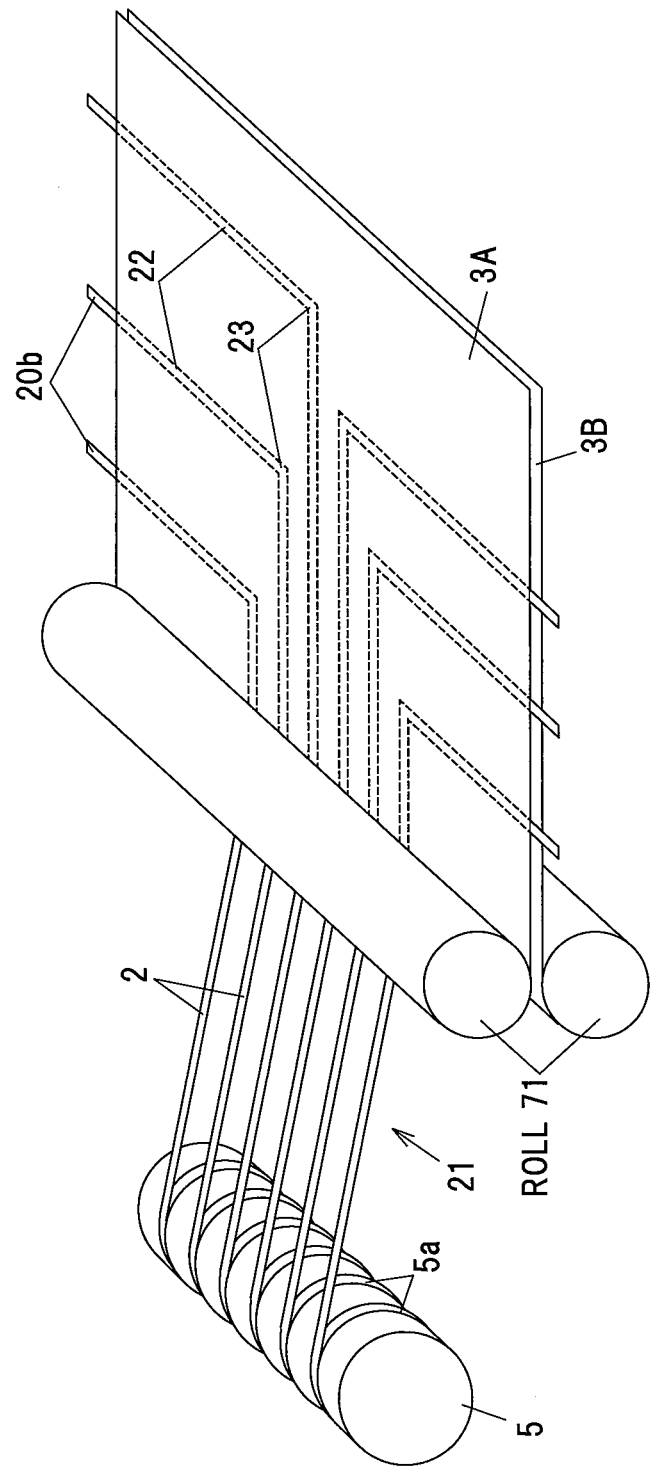
FIG. 5 is a perspective view schematically showing the step of covering the conductors with a covering member.
Figure 6:
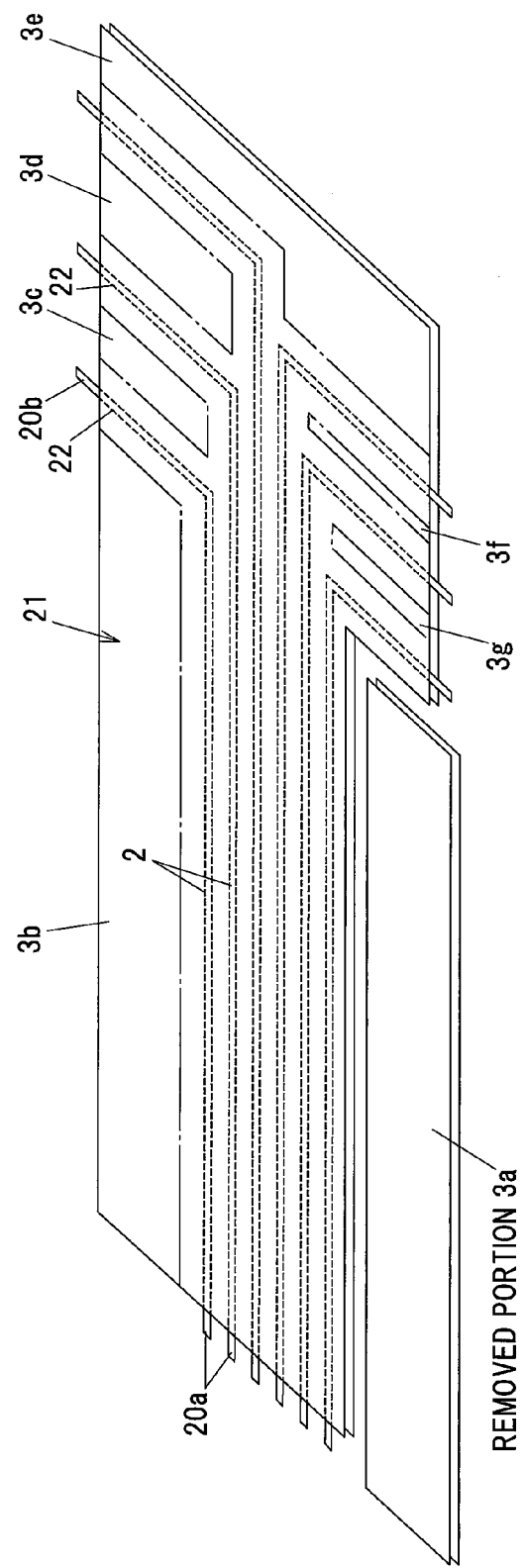
FIG. 6 is a perspective view schematically showing the step of removing a portion to be removed of the covering member.

Next, one example of a method for fabricating the wiring material 1 will be explained. FIGS. 2 to 6 are diagrams showing a method for fabricating the wiring material. FIG. 2 is a perspective view schematically showing the step of drawing the conductors from a reel. FIG. 3 is a perspective view schematically showing the step of bending the conductor. FIG. 4 is a perspective view schematically showing a state in which each conductor is branched. FIG. 5 is a perspective view schematically showing the step of covering the conductor with the covering member. FIG. 6 is a perspective view schematically showing the step of removing a portion to be removed of the covering member.

The method for fabricating the wiring material 1 includes preparing a reel 5 including a plurality of grooves 5a for receiving the conductors 2, each of which comprising a cross section comprising a predetermined thickness and a width not less than the predetermined thickness, providing from the reel 5 the trunk portion 21 with the conductors 2 arranged parallel therein, bending with a bending apparatus 6 and branching the conductor 2 from the trunk portion 21 provided, in the direction of the width of the conductors 2, to thereby form the branch portion 22, preparing a pair of rolls 71 to wind and receive the covering members 3A and 3B therearound, and cover the conductors 2 with the covering member 3 pulled out from the rolls 71, and removing portions in contact with each other of the pair of covering members 3A and 3B.

(1) Step of Providing the Conductors

As shown in FIG. 2, the reel 5 around which the conductors 2 are wound is held by a holding member (not shown) and is disposed parallel to the direction of the width of the conductors 2.

Firstly, as shown in FIG. 2, the plurality of conductors 2 are pulled out from the reel 5 by a length sufficient to be bent. In addition, by receiving a plurality of different electrically conductive materials around the reel 5, and drawing the conductive materials from the reel 5, it is possible to fabricate the wiring material 1 with the different conductor materials mixed therein.

(2) Step of Branching the Conductors

Figure 7A:
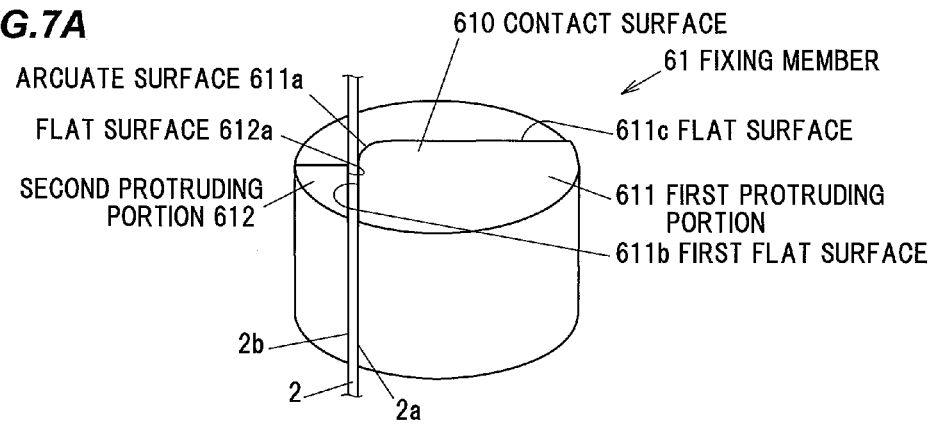
Figure 7B:
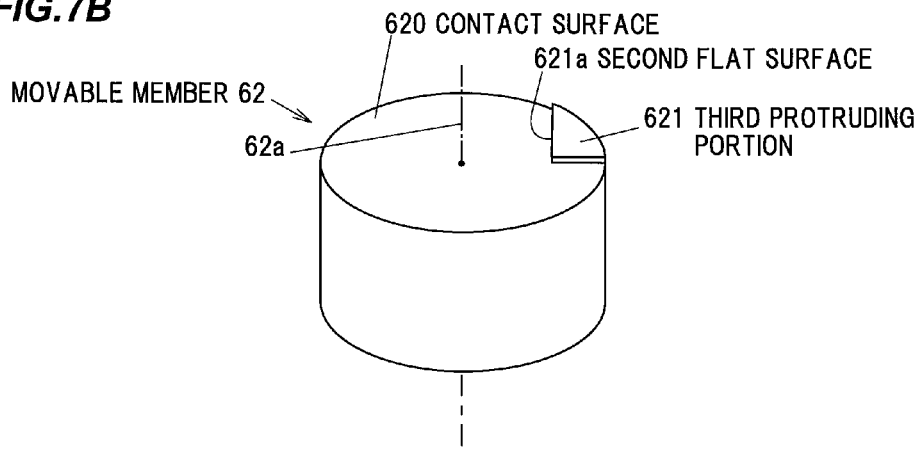
Figure 7C:
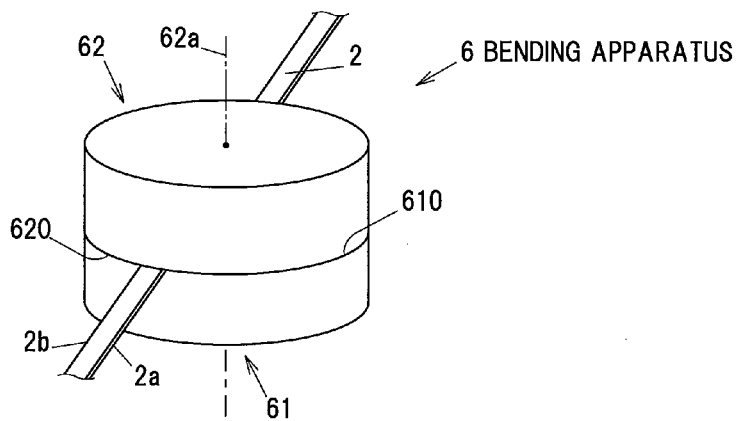
Figure 8A:
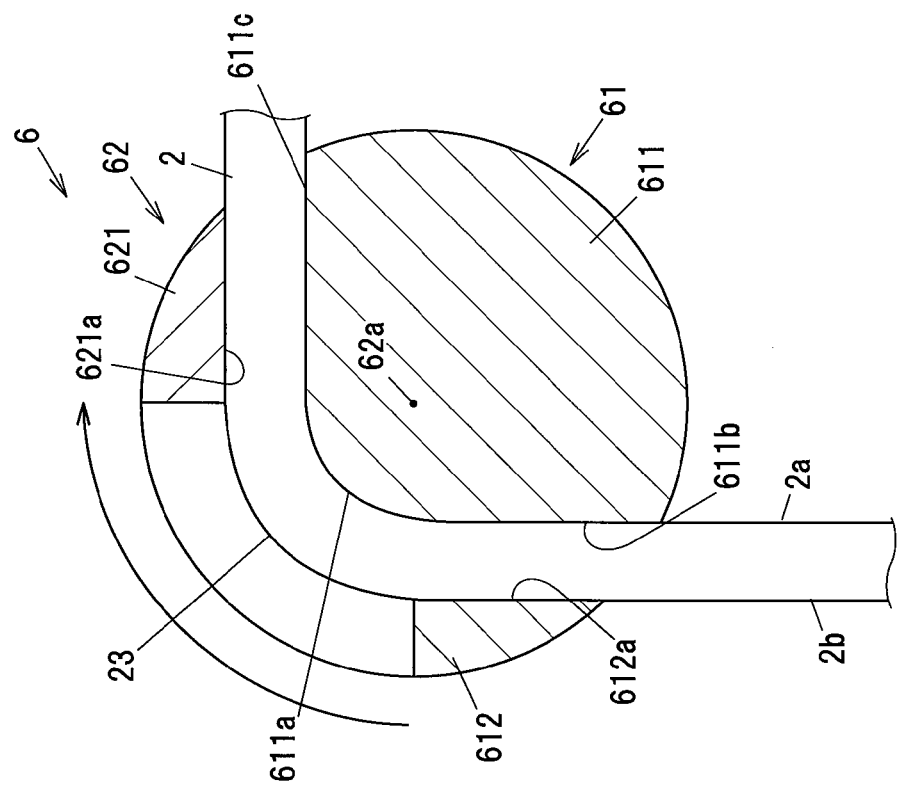
Figure 8B:
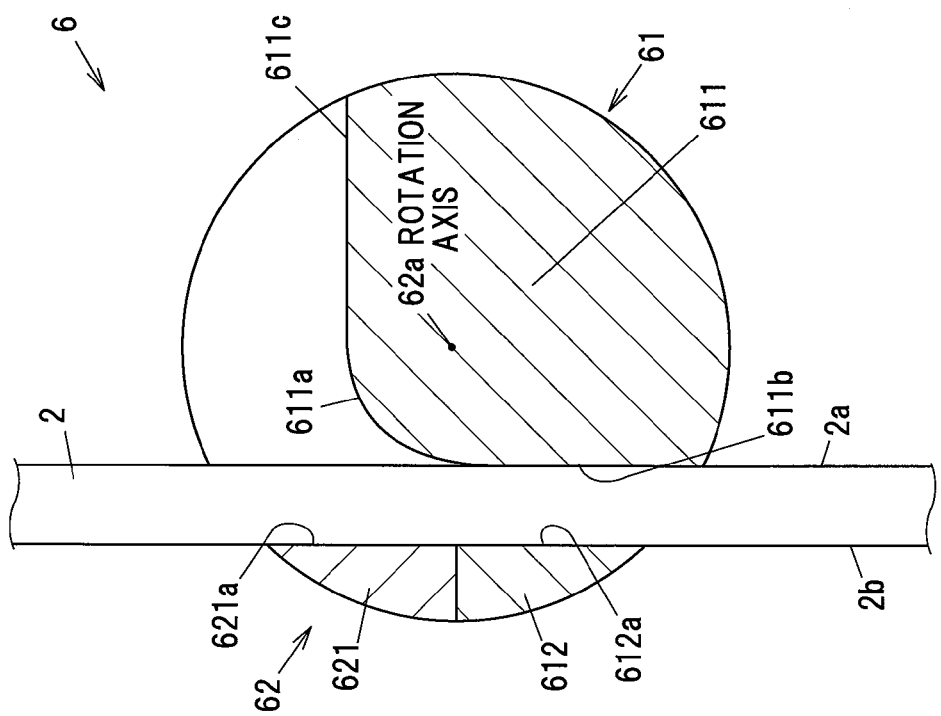

Next, as shown in FIG. 3, the conductors 2 are branched by bending each conductor 2 using a bending apparatus 6 shown in FIG. 7 which will be described later. Note that FIG. 3 illustrates only one of bending apparatuses 6. FIGS. 7A to 7C show a schematic of the bending device, wherein FIG. 7A is a perspective view showing a fixing member, FIG. 7B is a perspective view showing a movable member, and FIG. 7C is a perspective view showing a state in which the movable member and the fixing member are combined together. FIGS. 8A and 8B show the operation of the bending apparatus, wherein FIG. 8A is a transverse cross-sectional view showing a state before bending the conductors, and FIG. 8B is a transverse cross-sectional view showing a state after bending the conductors.

As shown in FIGS. 7A to 7C, this bending apparatus 6 includes a columnar fixing member 61 comprising a first protruding portion 611 including an arcuate surface 611a, a first flat surface 611b following to the arcuate surface 611a, and a flat surface 611c, and a second protruding portion 612 including a flat surface 612a provided to have the same distance as the width of the conductor 2 between it and the first flat surface 611b to fix the conductor 2, and a columnar movable member 62 comprising a third protruding portion 621 including a second flat surface 621a, which moves along the arcuate surface 611a with the conductor 2 sandwiched between it and the arcuate surface 611a. The fixing member 61 and the movable member 62 are disposed coaxially, and include contact surfaces 610 and 620 respectively at which the movable member 62 is rotatably combined and contacted with the fixed member 61. The fixing member 61 is supported by a support portion (not shown). The movable member 62 includes a rotary shaft 62a, and is rotated by a driving portion or manual manipulation not shown. Incidentally, FIGS. 8A and 8B show the bending apparatus which bends the conductor 2 clockwise.

To bend the conductor 2, first, as shown in FIG. 7A, the first flat surface 611b of the first protruding portion 611 of the fixing member 61 is brought into contact with the side surface 2a of the conductor 2, and the flat surface 612a of the second protruding portion 612 is brought into contact with the side surface 2b of the conductor 2 to fix the conductor 2.

Next, as shown in FIGS. 7C and 8A, the fixing member 61 and the movable member 62 are combined together so that the opposite side surface 2b to the side surface 2a of the conductor 2 with which the first flat surface 611b comes into contact is brought into contact with the second flat surface 621a, and the contact surfaces 610 and 620 are contacted together.

Then, from the state in which the second flat surface 621a is in contact with the side surface 2b of the conductor 2, the movable member 62 is rotated around the rotation axis 62a, and as shown in FIG. 8B, with the conductor 2 sandwiched between the arcuate surface 611a and the second flat surface 621a, the second flat surface 621a is moved along the arcuate surface 611a and the conductor 2 is bent by e.g. 90 degrees. That is, the conductor 2 is bent by pressing the conductor 2 against the arcuate surface 611a and the flat surface 611c while moving the second flat surface 621a.

Each conductor 2 is bent by a desired angle with the bending apparatus 6, and, as shown in FIG. 4, is shaped to comprise the trunk portion 21 and the branch portion 22. Alternatively, some of the conductors 2 may be left straight without being bent. Further, in the bending apparatus 6, it is possible to easily change the shapes of the arcuate surface 611a and the flat surface 611c, and to change the angle of bending the conductor 2 by changing the rotation angle of the movable member 62.

(3) Step of Covering the Conductors

The covering members 3A and 3B are wound and received around the pair of rolls 71. As shown in FIG. 5, the pair of rolls 71 are held by a holding member (not shown) from the upper side and the lower side of the conductors 2 so as to be parallel to the direction of the width of the conductors 2.

Next, as shown in FIG. 5, while providing the conductors 2 from the reel 4, the covering members 3A and 3B are pulled out from the pair of rolls 71. As shown in FIG. 1 and FIG. 5, the covering members 3A and 3B are overlapped together in a rectangular area surrounded by the end 20a and the end 20b or a rectangular area surrounded by the end 20b and the end 20b, and cover the conductors 2 so as to expose the ends 20a and 20b of the conductors 2. It is also possible to cover the conductors 2 by folding the covering member 3 pulled out from one of the rolls 71.

(4) Step of Removing the Covering Member

Next, as shown in FIG. 6, portions (removal portions) 3a to 3g at which the covering members 3 are in contact with each other are removed with margins left for bonding by a cutting method such as die punching, a cutter, and a laser. In FIG. 7, the portion 3a is shown as being removed, but the other portions 3b to 3g are removed in the same way.

Effects of the First Embodiment

This embodiment has the following effects.

(a) The use of the conductor 2 having a cross section comprising a predetermined thickness and a width not less than the predetermined thickness allows suppressing an increase in conductor resistance even when the wiring material is thinned.

(b) Since it is possible to provide the wiring material 1 having no connection portion between the branch portions 22 and the trunk portion 21 by bending each conductor 2 at a desired angle with the bending apparatus 6 to branch the wiring material 1, it is possible to omit the step of connecting the branch portions 22 and the trunk portion 21, thereby simplify the producing process of the wiring material 1.

(c) Even when the cross section of the conductor 2 is rectangular, it is possible to easily bend the conductor 2 by using the bending apparatus 6.

(d) By providing the conductor 2 with a rectangular cross section, it is possible to reduce the conductor resistance in comparison with a conductor using copper foil or a conductor having a circular cross section.

(e) By drawing the conductors 2 from the reel 5 and branching the conductors 2 with the bending apparatus 6 to form the wiring material 1, it is possible to omit etching in the producing process of the wiring material 1, and simplify the producing process of the wiring material 1. Therefore, it is possible to reduce the production cost of the wiring material 1. Further, since the dimensions of the wiring material 1 are not constrained to the size of a photolithographic apparatus used in the wiring pattern forming step, it is possible to easily produce the wiring material 1 with a desired length.

(f) By the step of removing the portions 3a to 3g of the covering member 3, it is possible to set each of the widths of the branch portion 22 and the trunk portion 21 at the conductor covering width.

(Modifications)

Incidentally, the present invention is not limited to each embodiment above, and various modifications may be made without altering the spirit of the invention. For example, the branch portions 22 may be provided such that the ends 20b have different distances from the center line 21a.

Further, by using the thicker conductor 2, the ends 20a and 20b may be configured to be inserted into through holes of a connecting member, for example.

Further, the wiring material 1 may have the conductors 2 which are bent several times by the bending apparatus 6.

Further, although in the present embodiment, the branch portions 22 are formed on both the sides of the trunk portion 21, the branch portions 22 may be formed on only one side of the trunk portion 21.

In the fabrication method in the above embodiment, the step additions, deletions, replacements, substitutions, and the like may be made without altering the spirit of the invention.

Second Embodiment

Figure 9:
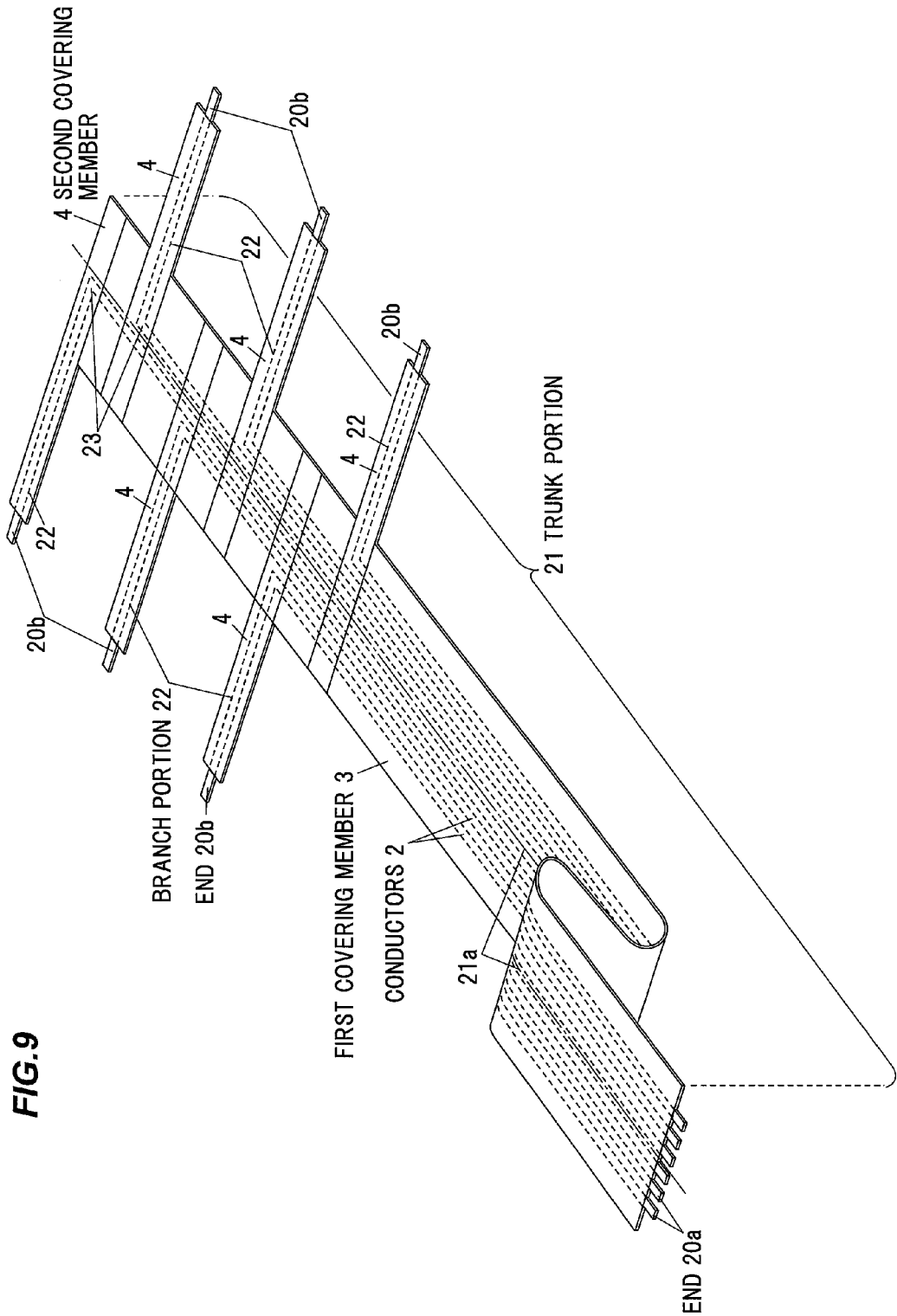
FIG. 9 is a perspective view showing the appearance of a wiring material in the second embodiment according to the present invention.

FIG. 9 is a perspective view showing the appearance of a wiring material in the second embodiment according to the present invention. The wiring material 1 comprises a plurality (six in the present embodiment) of conductors 2, each of which comprising a cross section comprising a predetermined thickness and a width greater than the predetermined thickness, a trunk portion 21 in which the plurality of the conductors 2 are spaced parallel in a direction of the width thereof, a branch portion 22 in which the conductor 2 is bent and branched from the trunk portion 21 in the direction of the width of the conductors 2, a first covering member 3 for covering the trunk portion 21 in such a manner as to expose the end 20a of the conductor 2 on a side of the trunk portion 21, and a second covering member 4 for covering the branch portion 22 in such a manner as to expose the end 20b of the conductor 2 on a side of the branch portion 22.

In the wiring material 1, the ends 20a of the conductors 2 are partially exposed from the first covering member 3 in the trunk portion 21, the ends 20b of the conductors 2 are partially exposed from the second covering member 4 in the branch portions 22, and at least one (six in the present embodiment) of the conductors 2 is branched in the direction of the width of the conductors 2 or in a direction that intersects the direction of the width of the conductors 2 at branched portions 23.

(Conductor 2)

The configuration of the trunk portion 21 and the branch portion 22 other than the above description is the same as in the first embodiment.

The configuration of the branched portions 23 and the material, configuration, shape and the like of the conductors 2 other than the above description are also the same as in the first embodiment.

(First and Second Covering Members)

The first covering member 3 comprises a pair of first covering members 3A and 3B, and the pair of first covering members 3A and 3B partially cover the trunk portion 21 and the branch portion 22 of the conductors 2 to expose the ends 20a. The first covering member 3 fixes and insulates the trunk portion 21 with the conductors 2 disposed parallel therein which is required to have the accuracy of parallelism of the conductors 2, by covering the conductors 2 with the one pair of first covering members 3A and 3B.

The second covering member 4 comprises a pair of second covering members 4A and 4B, and the pair of second covering members 4A and 4B cover the branch portion 22 to expose the ends 20b. Furthermore, by being overlapped with the first covering member 3, the second covering member 4 partially covers the trunk portion 21 and the branch portion 22 covered with the first covering member 3. By partially covering the trunk portion 21 and the branch portion 22, the second covering member 4 insulates and reinforces the branch portions 22 and the branched portions 23.

The first and second covering members 3 and 4 are bonded to the conductors 2 or the first covering member 3 in contact therewith, with an adhesive (not shown) applied to the facing surface. Incidentally, the first and the second covering members 3 and 4 may cover the trunk portion 21 and the branch portion 22 by a method such as fusion.

As the first and second covering members 3 and 4, e.g. polyimide, polyamide, polyethylene terephthalate or the like as an insulating member may be used. As an adhesive, e.g. epoxy based adhesive, polyester based adhesive or the like may be used. Note that different materials covering members and adhesives may be used for the first and second covering members 3 and 4.

(Method for Fabricating the Wiring Material)

Figure 10:
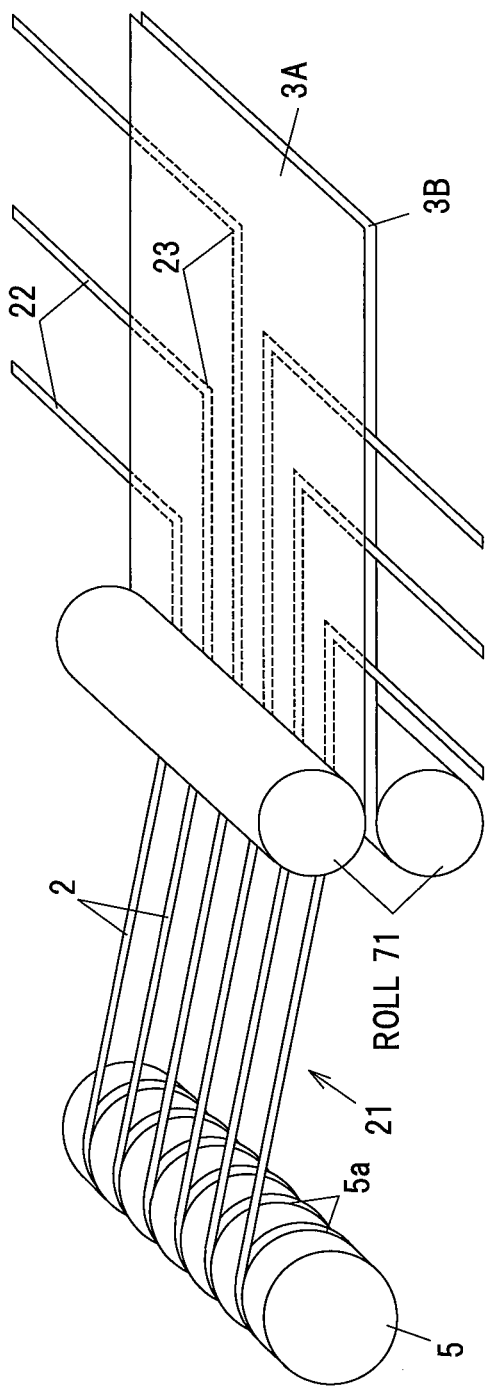
FIG. 10 is a perspective view schematically showing the step of covering conductors with a first covering member.
Figure 11:
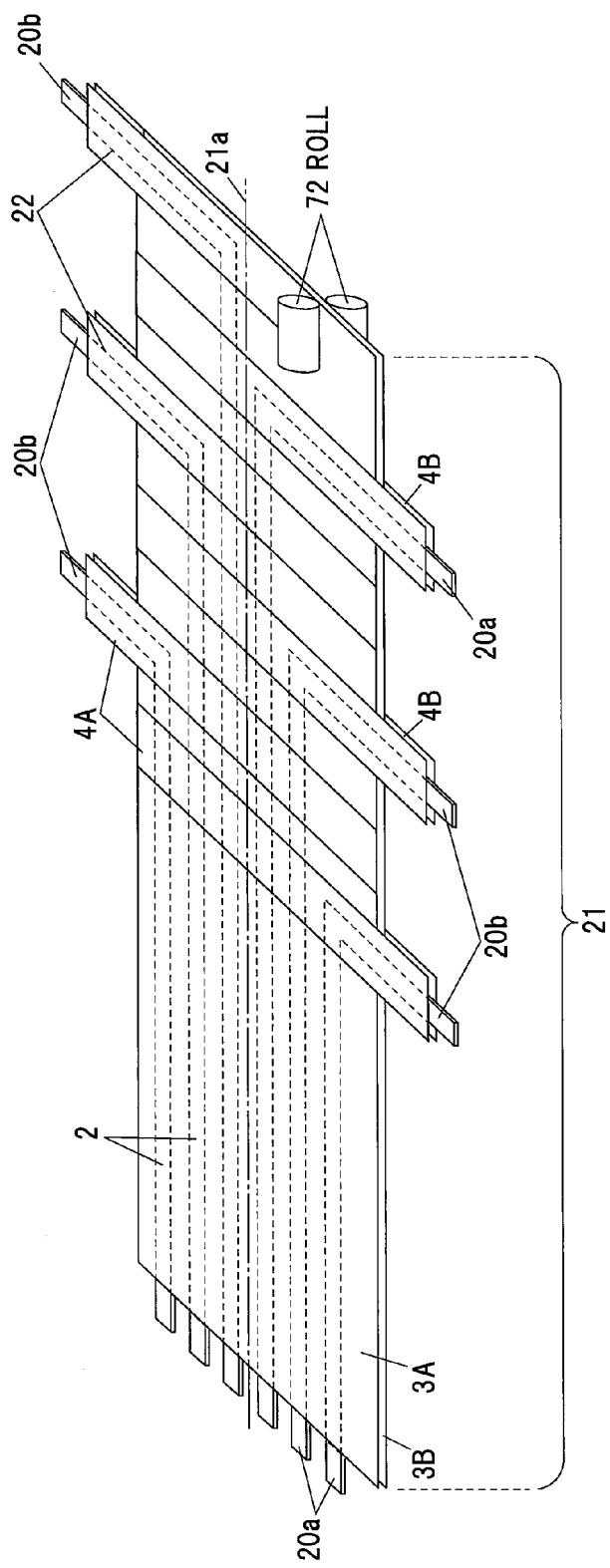
FIG. 11 is a perspective view schematically showing the step of covering conductors with a second covering member.

Next, one example of a method for fabricating the wiring material 1 in the second embodiment will be explained. The steps shown in FIGS. 2 to 4 are the same as the steps respectively the method for fabricating the wiring material in the first embodiment, and the steps shown in FIGS. 10 and 11 are different from the steps shown in FIGS. 5 and 6 respectively. FIG. 10 is a perspective view schematically showing the step of covering the conductors with the first covering member, and FIG. 11 is a perspective view schematically showing the step of covering the conductors with the second covering member.

The method for fabricating the wiring material 1 comprises preparing a reel 5 including a plurality of grooves 5a for winding and receiving the conductors 2 therearound, each of which having a cross section comprising a predetermined thickness and a width not less than the predetermined thickness, providing from the reel 5 the trunk portion 21 with the conductors 2 arranged parallel therein, bending with a bending apparatus 6 and branching the conductor 2 from the trunk portion 21 provided, in the direction of the width of the conductors 2, to thereby form the branch portion 22, preparing a pair of rolls 71 to wind and receive the first covering members 3A and 3B therearound, and partially cover the trunk portion 21 and the branch portion 22 of the conductor 2 with the first covering member 3 pulled out from the rolls 71, and preparing a pair of rolls 72 to wind and receive the second covering members 4A and 4B therearound, and partially cover the trunk portion 21 covered by the first covering member 3 and the branch portion 22 of the conductor 2 with the second covering member 4 pulled out from the rolls 72.

Because the steps (1) and (2) shown in FIGS. 2 to 4 are the same as the steps respectively of the producing method of the wiring material in the first embodiment, the description thereof will be omitted. The following describes the steps shown in FIGS. 10 and 11 respectively.

(3) Step of Covering by Using the First Covering Member

As shown in FIG. 10, the pair of rolls 71 are held by a holding member (not shown) from the upper side and the lower side of the conductors 2 to be parallel in the direction of the width of the trunk portion 21.

Next, as shown in FIG. 10, while providing the conductors 2 from the reel 5, the first covering members 3A and 3B are pulled out from the pair of rolls 71. The pair of first covering members 3A and 3B are overlapped together, and partially cover the trunk portion 21 and the branch portion 22 to expose the ends 20a of the conductors 2.

(4) Step of Covering by Using the Second Covering Member

As shown in FIG. 11, the pair of rolls 72 are held by a holding member (not shown) from the upper side and lower side of the conductors 2 to be parallel to the direction along the center line 21a of the trunk portion 21.

Next, as shown in FIG. 11, the second covering members 4A and 4B are pulled out in a direction perpendicular to the center line 21a of the trunk portion 21 from the pair of rolls 72. And, the pair of second covering members 4A and 4B are overlapped together, and cover the branch portion 22 to expose the end 20b of the conductor 2. Also, the second covering members 4A and 4B partially cover the trunk portion 21 and the branch portion 22 by overlapping the first covering member 3.

Effects of the Second Embodiment

This embodiment has the following effects.

(a) Since the conductors 2 are bent and branched, no connection portion is formed between the branch portion 22 and the trunk portion 21, so that it is possible to maintain the strength of the branched portions 23. Further, it is possible to omit the step of connecting the branch portion 22 and the trunk portion 21 and therefore simplify the producing process of the wiring material 1.

(b) In the case where both the trunk portion and the branch portion are covered with the pair of the rectangular covering members, the portions in which the pair of covering members overlap each other will be removed. However, in the present embodiment, the trunk portion 21 and the branch portion 22 are divided and covered with the first and the second covering members 3 and 4. Since the use amount of the first and the second covering members 3 and 4 can be reduced, it is possible to reduce the production cost of the wiring material 1.

(c) Also, since the second covering member 4 covers the branched portions 23 and the branch portions 22 covered by the first covering member 3, it is possible to reinforce the branch portions 22 and the branched portions 23.

(d) By drawing the conductors 2 from the reel 5 and branching the conductors 2 with the bending apparatus 6 to produce the wiring material 1, it is possible to omit etching in the fabrication process of the wiring material 1, and thereby simplify the fabrication process of the wiring material 1. Therefore, it is possible to reduce the production cost of the wiring material 1. Further, since the dimensions of the wiring material 1 are not constrained to the size of a photolithographic apparatus used in the wiring pattern forming step, it is possible to easily produce the wiring material 1 of a desired length.

(e) Because the trunk portion 21 which is required to have parallelism, etc. of the conductors 2 is covered with the first covering member 3, the precise covering of the conductors 2 is achieved. Therefore, it is possible to fabricate the wiring material 1 with less insulation failure and the like by the simple producing process.

(Modifications)

Incidentally, the invention is not limited to each embodiment above, and various modifications may be made without altering the spirit of the invention. For example, although in the above embodiment, the second covering member 4 has been described as partially covering the trunk portion 21 by being overlapped with the first covering member 3, the second covering member 4 may cover only the branch portion 22 exposed from the first covering member 3 without being overlapped with the first covering member 3.

Further, although in the above embodiment, it has been described that the conductors 2 are covered by drawing the second covering member 4 in a direction perpendicular to the center line 21a, the conductors 2 may be covered by drawing the second covering member 4 in a direction along the center line 21a and being partially overlapped with the first covering member 3.

Further, the trunk portion 21 and the branch portion 22 may be covered by folding the first and the second covering members 3 and 4.

The first and the second covering members 3 and 4 may cover the trunk portion 21 and the branch portions 22 by using the first and the second covering members 3 and 4 which are cut into strips in advance, without being limited to the method to draw from the rolls.

Further, although in the present embodiment, the branch portion 22 is formed on both the sides of the trunk portion 21, the branch portion may be formed only on one side of the trunk portion.

In the production method in the above embodiment, the step additions, deletions, replacements, substitutions, and the like may be made without altering the spirit of the invention. For example, after covering the conductors 2 with the second covering member 4, the branch portion 22 may be covered by superimposing the first covering member 3 on the second covering member 4.

INDUSTRIAL APPLICABILITY

The present invention can be applied to a secondary battery device and electronic equipment, for example, a voltage monitoring wiring material, power transport line, signal line, mobile phone, communication equipment, information terminal equipment, measurement equipment, consumer electronics equipment, etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A wiring material comprising:
conductors, each conductor comprising a conductor trunk portion extending in a longitudinal direction of the wiring material and a conductor branch portion directly branched from without overlapping the conductor trunk portion in a direction intersecting the width direction; and
a covering member collectively covering around the conductor trunk portion and the conductor branch portion to expose both ends of the conductors, the conductor trunk portion being arranged in parallel in the width direction in the covering member,
wherein the covering member comprises a trunk covering portion for covering the conductor trunk portions and branch covering portions each of which covers the conductor branch portion.

2. The wiring material according to claim 1, wherein each conductor has a rectangular cross section.

3. The wiring material according to claim 1, wherein the covering member comprises: a first covering member for covering the trunk portion to expose an end of each conductor on a side of the trunk portion; and a second covering member for covering the branch portion to expose an end of the conductor on a side of the branch portion.

4. The wiring material according to claim 3, wherein the second covering member is partially overlapped with the first covering member to cover a portion of the trunk portion covered with the first covering member.

5. A secondary battery device comprising the wiring material according to claim 1.

6. An electronic equipment comprising the wiring material according to claim 1.

7. The wiring material according to claim 1, wherein each conductor has a cross section comprising a predetermined thickness and a width not less than the predetermined thickness.

8. The wiring material according to claim 1, wherein the wiring material has a same thickness in the longitudinal direction.

9. The wiring material according to claim 8, wherein the branch portion of each conductor is coplanar with the trunk portion where it directly branches from.

10. A wiring material comprising:
conductors, each conductor comprising a conductor trunk portion extending in a longitudinal direction of the wiring material and a conductor branch portion directly branched from without overlapping the conductor trunk portion in a direction intersecting the width direction; and
a covering member collectively covering around the conductor trunk portion and the conductor branch portion to expose both ends of the conductors, the conductor trunk portion being arranged in parallel in the width direction in the covering member,
wherein the covering member comprises: a first covering member for covering the trunk portion to expose an end of each conductor on a side of the trunk portion; and a second covering member for covering the branch portion to expose an end of the conductor on a side of the branch portion, and
wherein the second covering member is partially overlapped with the first covering member to cover a portion of the trunk portion covered with the first covering member.

* * * * *